(12) United States Patent
Rhee

(10) Patent No.: US 7,033,880 B2
(45) Date of Patent: Apr. 25, 2006

(54) INDUCTOR FOR SEMICONDUCTOR DEVICE AND METHOD OF MAKING SAME

(75) Inventor: Tae-Pok Rhee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 09/935,002

(22) Filed: Aug. 21, 2001

(65) Prior Publication Data

US 2002/0013005 A1    Jan. 31, 2002

Related U.S. Application Data

(62) Division of application No. 08/974,371, filed on Nov. 19, 1997, now Pat. No. 6,303,971.

(30) Foreign Application Priority Data

Nov. 19, 1996  (KR) .................................. 96-55392
Nov. 18, 1997  (KR) .................................. 97-60671

(51) Int. Cl.
*H01L 21/8234* (2006.01)
(52) U.S. Cl. ...................... 438/238; 438/381; 438/622
(58) Field of Classification Search ................ 438/238, 438/381, 618–679
See application file for complete search history.

(56) References Cited

U.S. PATENT DOCUMENTS

| 3,290,758 A |   | 12/1966 | Moyer |
|---|---|---|---|
| 3,614,554 A |   | 10/1971 | Shield et al. |
| 5,372,967 A | * | 12/1994 | Sundaram et al. .......... 438/381 |
| 5,514,832 A |   | 5/1996 | Dusablon, Sr. et al. |
| 5,548,265 A | * | 8/1996 | Saito .......................... 336/200 |
| 5,863,806 A | * | 1/1999 | Lue ................................ 438/3 |
| 6,236,538 B1 | * | 5/2001 | Yamada et al. ............. 360/126 |

FOREIGN PATENT DOCUMENTS

JP          40-4302406       * 10/1992

* cited by examiner

*Primary Examiner*—H. Jey Tsai
(74) *Attorney, Agent, or Firm*—Marger Johnson & McCollom, P.C.

(57) ABSTRACT

An inductor for a semiconductor device is formed within a groove in an insulating layer on a semiconductor substrate. A number of lower conductive lines are formed across the groove. A cylindrical insulator is formed over the lower conductive lines and aligned with the groove. Upper conductive lines are formed over the cylindrical insulator. The upper and lower conductive lines are slanted lengthwise along the groove in opposite directions to form a spiral coil having a circular cross-section, thereby preventing abrupt changes in the magnetic field. The ends of upper conductive lines contact the ends of the lower conductive lines so that the thickness of the coil is controlled by the thickness of the cylindrical insulator, thereby allowing the self-inductance to be increased and the positional density of the conductive lines to be freely controlled.

32 Claims, 17 Drawing Sheets

US 7,033,880 B2

INDUCTOR FOR SEMICONDUCTOR DEVICE AND METHOD OF MAKING SAME

This application is a division of application Ser. No. 08/974,371, filed Nov. 19, 1997, now U.S. Pat. No. 6,303,971.

This application claims priority to Korean patent applications No. 96-55392 filed Nov. 19, 1996 and No. 97-60671 filed Nov. 18, 1997 in the name of Samsung Electronics Co., Ltd.

BACKGROUND OF THE INVENTION

1. Field of the Invention

The present invention relates generally to semiconductor devices, and more particularly to semiconductor devices including spiral inductors and a method of making the same.

2. Description of the Related Art

In forming a semiconductor device, the use of individual devices such as transistors, resistors, inductors, etc. is indispensable. Of all these devices, inductors are typically the most difficult to make since they have the most complicated structures.

FIGS. 1 to 4 are perspective views for explaining a conventional method of making inductors in a semiconductor device as disclosed in U.S. Pat. No. 3,614,554 ("Miniaturized Thin Film Inductors For Use In Integrated Circuits", application No. 770,375).

After collectors 13 of integrated circuits are formed in a semiconductor substrate 10 according to a design rule, the surface of the substrate is covered with a first insulating layer 12, and then conductive collector terminals 15 are formed which connect to the collectors 13. Then, after first through eighth lower conductive lines 14a to 14h constituting conductors are formed using metal materials (FIG. 1), an oxide film 16 is formed to cover the surface of the substrate on which the first through eighth lower conductive lines 14a to 14h are formed. Then, a bar 18 of magnetic material is formed on top of the oxide film 16 and across the first through eighth lower conductive lines 14a to 14h (FIG. 2).

Thereafter, a second insulating layer 20 is formed to cover the surface of the substrate on which the bar 18 is formed. First through eighth contact holes 22a to 22h are then formed in the insulating layer 20 thereby exposing one end of each of the first through eighth lower conductive lines 14a to 14h, and ninth through fifteenth contact holes 24a to 24h are formed so as to expose the other ends of the first through eighth lower conductive lines 14a to 14h. Next, a layer of metal material is formed on the oxide film 16 to cover the contact holes. The metal layer is then patterned to form upper conductive lines 26a through 26g. A first end of each of upper conductive lines 26a–26g is connected to a first end of each of lower conductive lines 14a–14g, respectively, through contact holes 22a–22g, respectively. A second end of each of upper conductive lines 26a–26g is connected to a second end of each of lower conductive lines 14b–14h, respectively, through contact holes 24b–24h, respectively.

The first through eighth lower conductive lines 14a to 14h and the first to the seventh upper conductive lines 26a to 26g form a single inductor coil.

FIG. 5 is a sectional view of a conventional conductor taken along line a–a' of FIG. 4, wherein the same reference numerals as those used in FIGS. 1 to 4 indicate the same components.

One end of the second lower conductive line 14b is connected to the second upper conductive line 26b, and the other end thereof is connected to the first upper conductive line 26a.

There are two disadvantages to an inductor fabricated as described above.

First, when the line width of the conductive lines of the inductor coil is reduced, the self-inductance L of the inductor is reduced as explained below, even though the thicknesses of the oxide film 16 and the second insulating layer 20 remain constant.

In an inductor coil that is wound with N turns around a magnetic material having a non-magnetic permeability of $\mu_S$ and a cross-sectional area of S, current I flowing through the inductor generates a magnetic field H, and the self-inductance L is given by Equation 1.

$$L = N\mu_0\mu_S HS/I \qquad \text{(Equation 1)}$$

When two inductors are fabricated, the mutual inductance is expressed by Equation 2, wherein i is current, V is voltage, $\Phi$ is magnetic flux density, and n is the number of turns.

$$M_{21} = n_2\Phi_{21}/i_1,\ M_{21} = M_{12} = M,\ V_1/V_2 = i_2/i_1 \qquad \text{(Equation 2)}$$

From Equation 1 it is apparent that the self-inductance L is proportional to the cross-sectional area S inside the coil. Assuming that the length of the semiconductor device 10 in a direction parallel to the bar 18 is "a" and the vertical length of the contact hole is "b" (see b in FIG. 5), the cross-sectional area is S=a×b.

In a device fabricated as described above with reference to U.S. Pat. No. 3,614,554, the dimension "a" is related to the size of the design which the inductor occupies, and "b" is determined by the sum of the thicknesses of the oxide film 16 and the second insulating layer 20. However, even when the thicknesses of the oxide film 16 and the second insulating layer 20 are held constant, reducing the width of the upper and lower conductive lines, for example, to less than 0.5 um, can reduce the value of L because, even though "a" may depend on the area the inductor occupies, the value of "b" is constrained since it is relatively dependent upon the line width, and thus, functions as a factor in reducing the value of L.

Second, because the inductor coil disclosed in the above-referenced U.S. Pat. No. 3,614,554 does not have a circular cross section, the magnetic field changes abruptly at the sharp turns in the coil as shown at I in FIG. 5.

SUMMARY OF THE INVENTION

It is an object of the present invention to solve the problems associated with the prior art, and to provide a semiconductor device including inductors in which the self-inductance can be increased easily and in which the magnetic field changes uniformly.

It is another object of the present invention to provide the most suitable method of making the inductor.

In order to accomplish these objects, a semiconductor device including inductors according to the present invention comprises: an insulating layer formed on a semiconductor substrate; a groove having a semicircular cross-section formed in said insulating layer; a cylindrical insulator aligned with said groove; and spring-shaped inductors having lower conductive lines formed between said insulator and said groove and upper conductive lines in contact with the lower conductive lines.

The lower conductive lines are slanted longitudinally along the groove and formed across the groove with a predetermined distance therebetween. The upper conductive lines are also slanted longitudinally along the groove and formed across the groove with a predetermined distance therebetween.

The ends of the upper conductive lines are connected to the ends of the lower conductive lines on both sides of the cylindrical insulator.

The semiconductor substrate is formed from either silicon or a compound semiconductor such as gallium arsenide etc. The entire surfaces of the lower conductive lines, except for the portions which contact the upper conductive lines, are covered with an oxide film and an oxidization prevention layer, in that order.

A method of making a semiconductor device including inductors according to the present invention comprises the steps of: forming a groove having a semicircular cross-section in an insulating layer on a semiconductor substrate; forming lower conductive lines with a predetermined distance therebetween in the groove; forming a cylindrical insulator above the lower conductive lines and aligned with the groove; and forming upper conductive lines on the insulator and in contact with said lower conductive lines.

The step of forming the groove further comprises the steps of: forming a nitride film on the insulating layer; forming a photosensitive film pattern for exposing the nitride film to form a groove; etching the nitride film by using the photosensitive film pattern as a mask; and etching the exposed insulating layer.

The lower conductive lines are formed across said groove and slanted longitudinally along the groove.

A method of making a semiconductor device including inductors further comprises the steps of: forming an insulating layer on the surface of the lower conductive lines; covering the entire surface of the substrate with an oxidization prevention layer; and burying a buried material between the conductive lines in the groove.

A method of making a semiconductor device including inductors further comprises the step of forming a contact region by etching the insulating layer and the oxidization prevention layer for connecting the lower and upper conductive lines.

The step of forming the insulating layer comprises the steps of: laminating an oxidizable material on the entire surface of the substrate; and forming the insulating layer on the surface of the substrate and the groove by oxidization of the oxidizable material.

The step of filling the groove with oxidizable materials further comprises the steps of: laminating oxidizable materials on the entire surface of the substrate to bury the groove; and etching the oxidizable materials to fill only the groove.

A semiconductor device including inductors according to the present invention comprises: a groove having a semicircular cross-section formed in an insulating layer on a semiconductor substrate; a magnetic core aligned with the groove; and inductors having a spring shape, the inductors having lower conductive lines formed between the magnetic core and the groove, and upper conductive lines formed on the magnetic core to contact the lower conductive lines. The lower and upper conductive lines are formed of aluminum or copper having low resistance value. The oxide film is formed between the substrate and the lower conductive lines, and between the lower conductive lines and the upper conductive lines.

A method of making a semiconductor device including inductors comprises the steps of: forming a groove having a semicircular cross-section in an insulating layer on a semiconductor substrate; forming lower conductive lines with a predetermined distance therebetween across the groove; forming a magnetic core in the groove over the lower conductive lines; and forming upper conductive lines on the magnetic core, the upper conductive lines contacting the lower conductive lines.

The step of forming groove comprises the steps of: forming an oxide film as a relief region on the substrate; forming a silicon nitride layer and a high temperature oxide film in on the oxide film; forming a trench by etching the oxide film, silicon nitride layer and high temperature oxide film; forming an oxide film on the entire surface of the substrate; forming an groove having a semicircular cross-section by wet-etching the oxide film; and removing the oxide film, silicon nitride layer and high temperature oxide film.

The step of forming the lower conductive lines comprises the steps of: forming an oxide film on the entire surface of the substrate; forming a conductive material on the oxide film; and forming lower conductive lines with a predetermined distance therebetween along the groove by patternizing the conductive material.

The step of forming the magnetic core comprises the steps of: forming an oxide film, a magnetic material and a capping oxide layer over the lower conductive lines; forming the magnetic core in the groove by patternizing the magnetic material; and wrapping the magnetic core with the oxide film by forming a spacer at both sides of the magnetic core.

BRIEF DESCRIPTION OF THE DRAWINGS

The above objects, and other features and advantages of the present invention will become more apparent by describing the preferred embodiment thereof with reference to the accompanying drawings, in which:

FIGS. 7A to 12A and 7B to 12B are sectional views and plan views, respectively, for illustrating the process flow for a first embodiment of a method of making a semiconductor device including inductors according to the present invention.

FIGS. 14A to 19A and 14B to 19B are sectional views and plan views, respectively, for illustrating the process flow for a second embodiment of a method of making a semiconductor device including inductors according to the present invention.

DETAILED DESCRIPTION

Figure 6A:
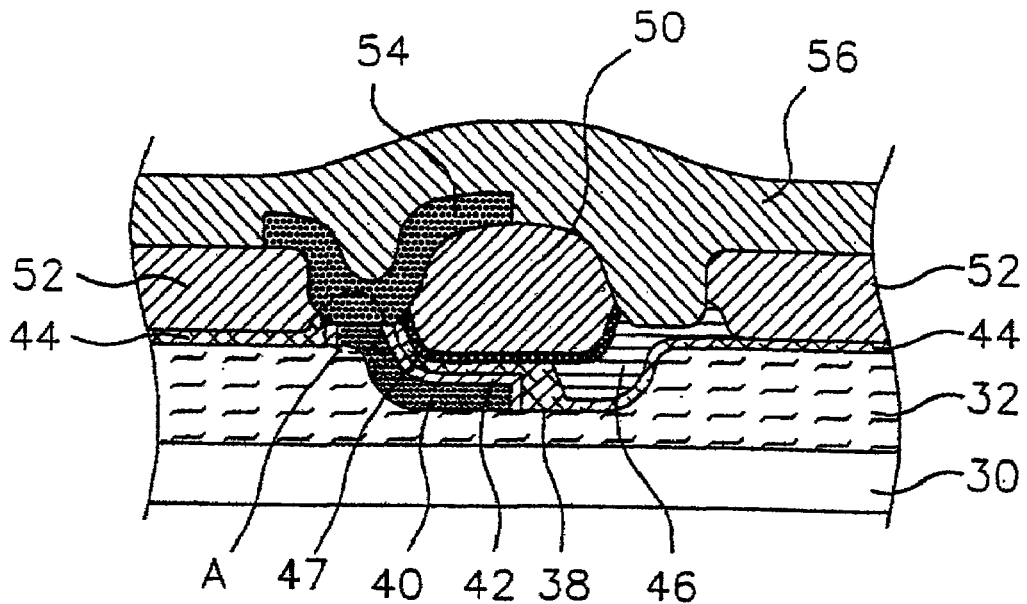
FIGS. 6A and 6B are a plan view and a sectional view, respectively, of a first embodiment of a semiconductor device including inductors, which is manufactured in accordance with the present invention.
Figure 6B:
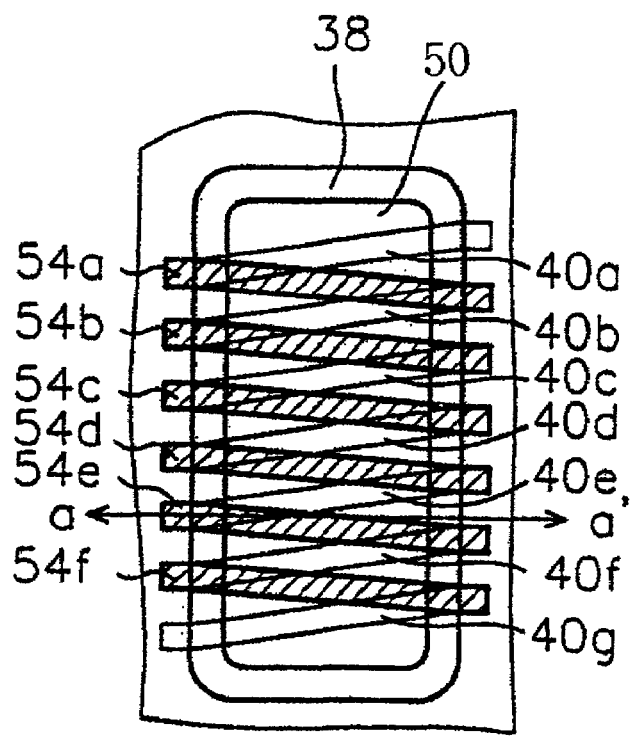

FIG. 6B is a plan view of a first embodiment of a semiconductor device including inductors according to the present invention, and FIG. 6A is a sectional view taken along line a–a' of FIG. 6B.

The semiconductor device of FIGS. 6A and 6B includes a groove having a semicircular cross-section 38 formed in an insulating layer 32 on a semiconductor substrate 30, lower conductive lines 40a–40g (collectively "40") formed across the groove 38 and slanted longitudinally with a predetermined distance therebetween along the groove 38, a cylindrical insulator 50 formed above the lower conductive lines and aligned with the groove 38, an insulator 52 formed on the flat part of the substrate, upper conductive lines 54a–54f (collectively "50") formed across the groove 38 and slanted longitudinally with a predetermined distance therebetween along the groove 38, and a magnetic core 47 formed above the lower conductive lines and below the insulator 50. The upper conductive lines 54a–54f slanted in the opposite direction from the lower conductive lines 40.

The semiconductor device of FIGS. 6A and 6B also includes an oxide film 42 formed over the lower conductive lines 40a–40g except for the contact portion A, an oxidization prevention film 44 formed on all the surfaces of the substrate except for the contact portion A, a buried layer 46 buried in the groove 38, and an oxide prevention film 56 formed over the entire semiconductor device on all surfaces of the substrate including the upper conductive lines 54.

The lower conductive lines 40 and upper conductive lines 54 are slanted in opposite directions so that each of the upper lines are connected to one end of the two neighboring lower conductive lines. That is, the first upper conductive line 54a is connected to one end of the first lower conductive line 40a and one end of the second lower conductive line 40b through contact portions A. The second upper conductive line 54b is connected to one end of the second lower conductive line 40b and one end of the third lower conductive line 40c through the contact portions A. The other upper conductive lines are connected to the lower conductive lines, respectively, in the same manner.

Therefore, both the upper conductive lines and the lower conductive lines form a spiral coil unlike the prior art.

In the present invention, the lower and upper conductive lines are made of polysilicon doped with impurities and conductive materials such as tungsten T etc. The semiconductor substrate 30 is made of a compound such as silicon (Si), gallium arsenide (GaAs), etc.

An inductor in accordance with the present invention solves problems associated with conventional inductors. First, the self-inductance of an inductor in accordance with the present invention is not dependent on the vertical length of the contact hole for connecting the upper and lower conductive lines, but instead, depends on the thickness of the insulator 50. Therefore, the self-inductance is not dependent on the line width of the conductive lines as with a conventional inductor.

Figure 1:
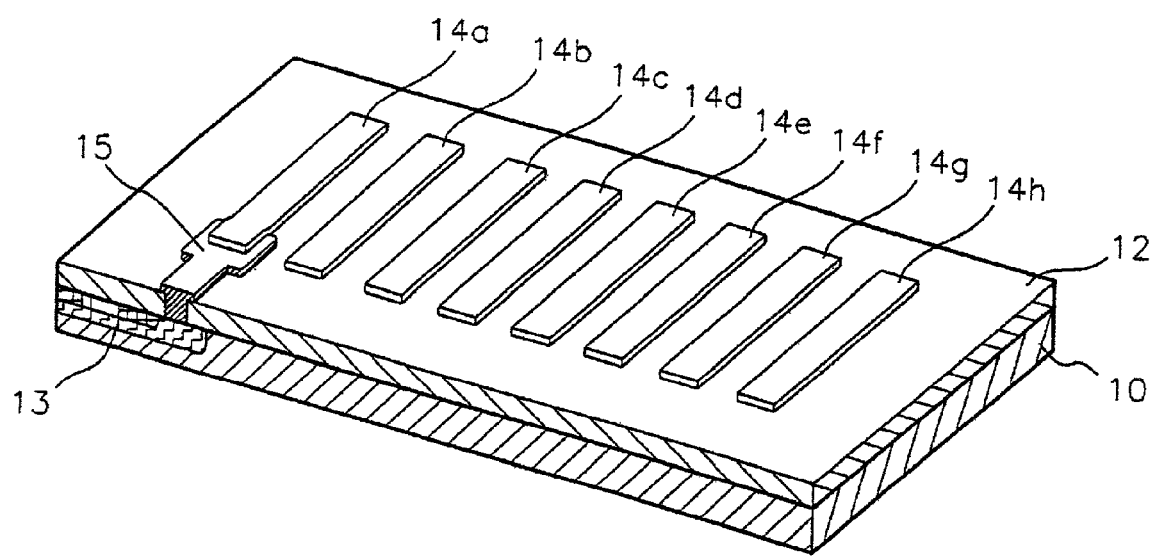
FIGS. 1 to 4 are perspective views for explaining a conventional method of making inductors on a semiconductor device.
Figure 2:
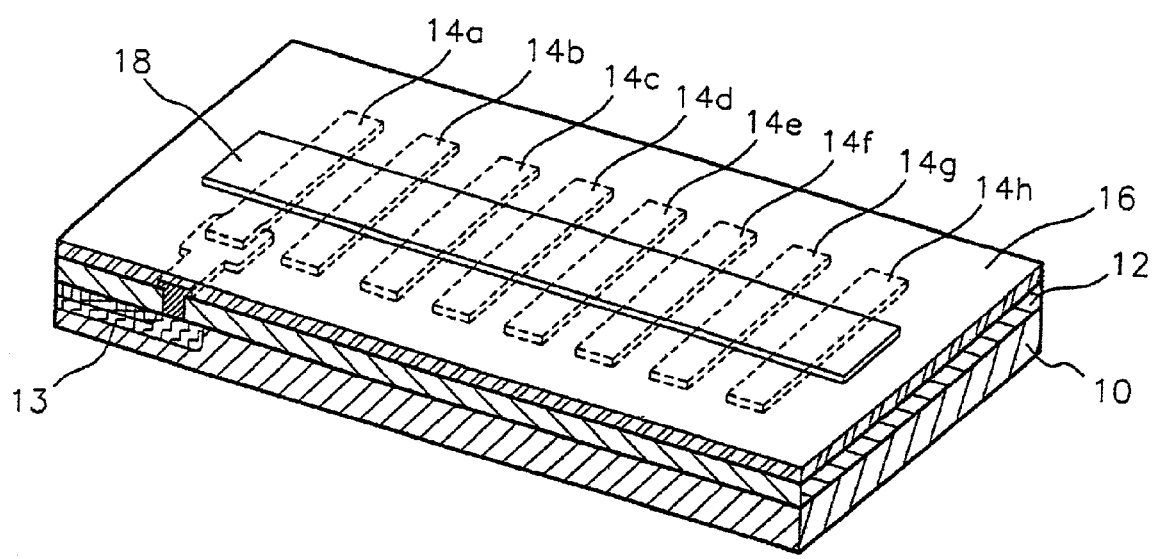
Figure 3:
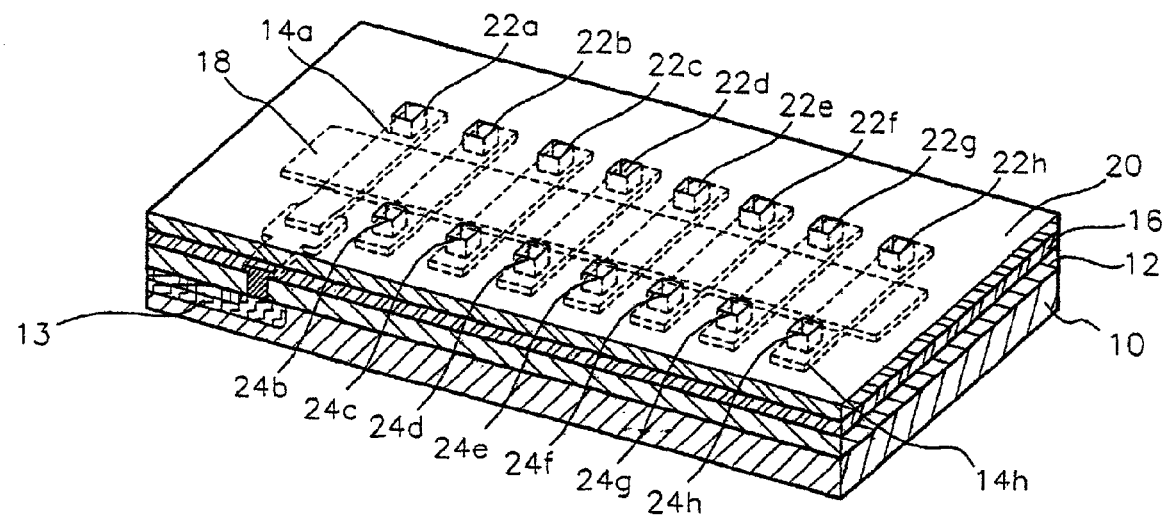
Figure 4:
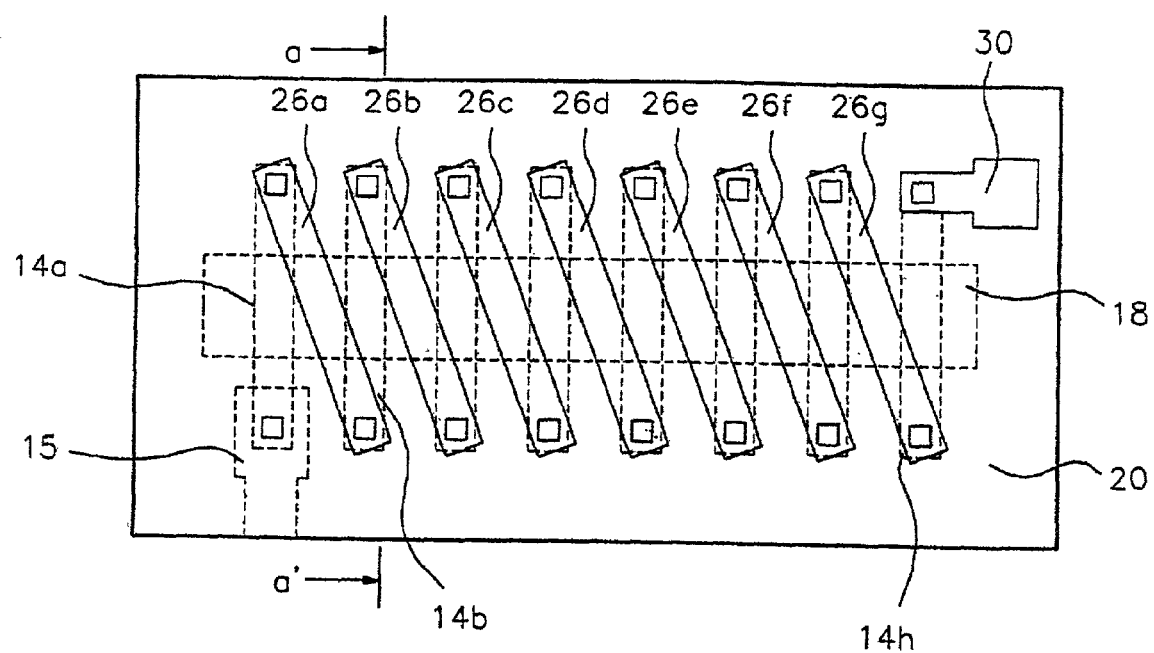
Figure 5:
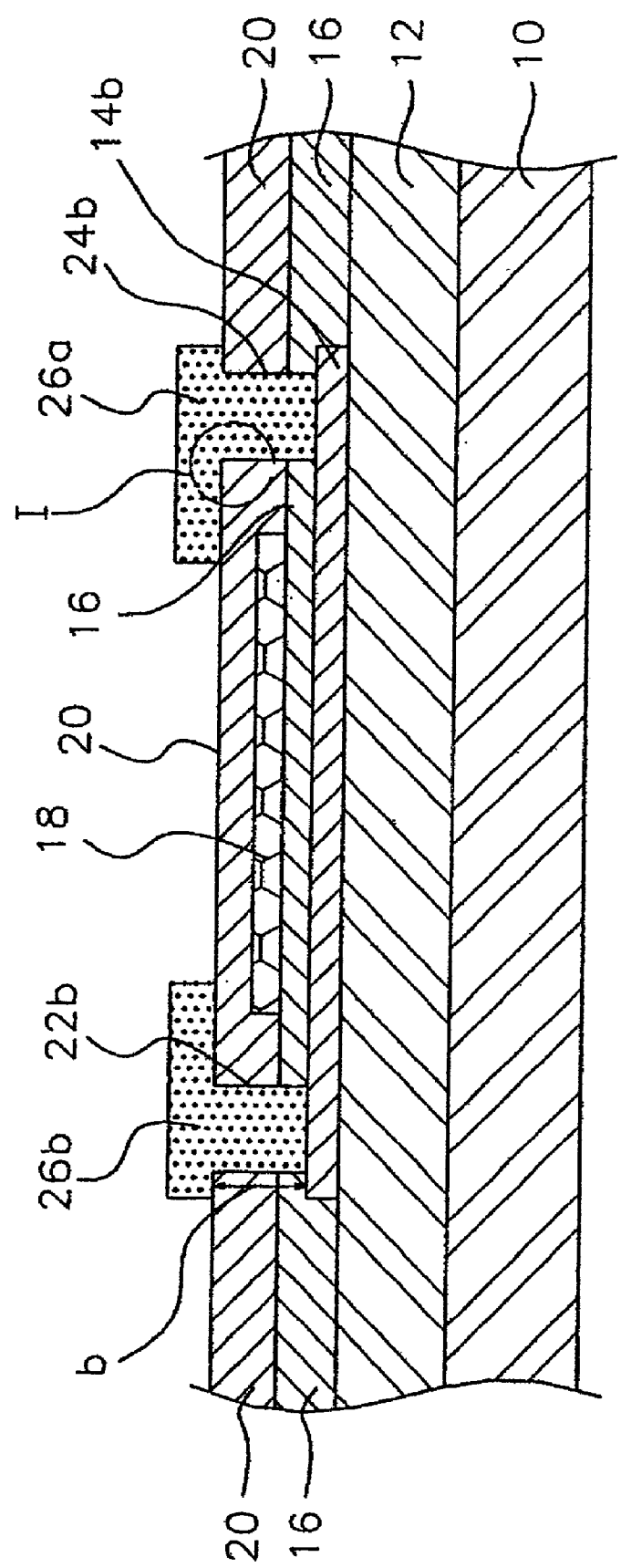
FIG. 5 is a sectional view of a conventional inductor taken along line a–a' of FIG. 4.

Also, since the cross-sectional shape of an inductor in accordance with the present invention is more nearly circular, there are no abrupt changes in the magnetic field where the coil bends (see I in FIG. 5).

FIGS. 7 to 12 are views for illustrating the process flow of a first embodiment of a method of making a semiconductor device including inductors according to the present invention, wherein the "A" figures are sectional views and the "B" figures are plan views.

Figure 7A:
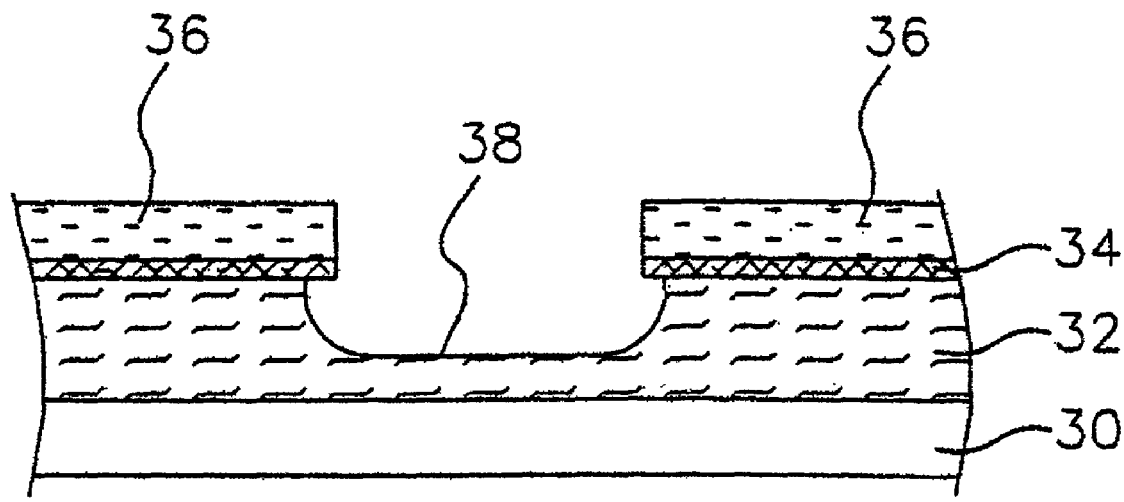
Figure 7B:
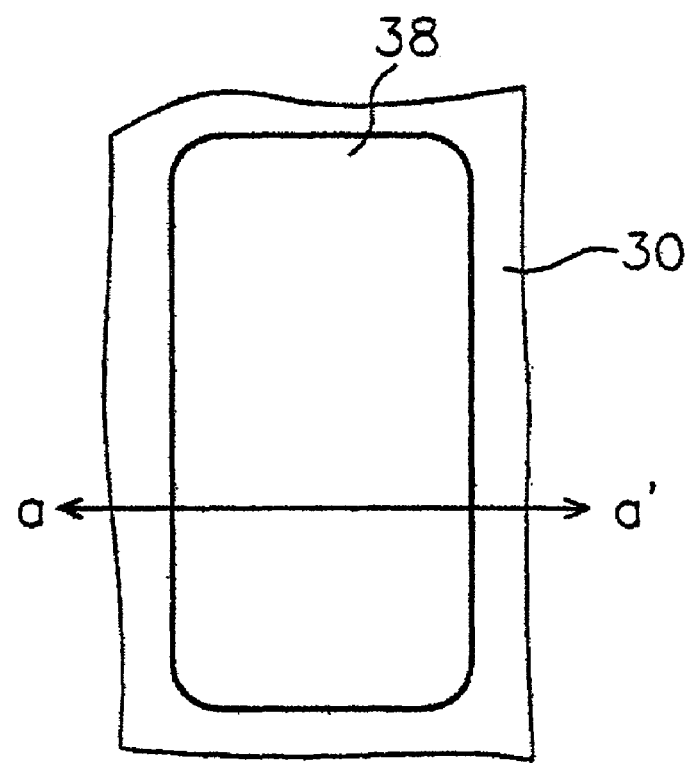

FIGS. 7A and 7B are views showing the semiconductor device after the groove 38 is formed. As can be seen from the drawings, a first insulating layer 32 is formed on a semiconductor substrate 30 made of silicon, gallium arsenide, etc., by depositing or growing an oxide film 32 to a thickness of 10,000 Å. Subsequently, a silicon nitride layer 34 is formed to a thickness of 1,500 Å on the first insulating layer 32, and a photosensitive film pattern 36 is formed on the silicon nitride layer 34. The photosensitive film pattern is exposed to form a pattern for the groove. Next, the first insulating layer 32 is exposed by etching the exposed silicon nitride layer 34 using photosensitive film pattern 36 as a mask. Subsequently, the groove 38 is formed by etching the exposed first insulating layer by a predetermined process such as anisotropic etching, isotropic etching, or combined anisotropic and isotropic etching.

Figure 8A:
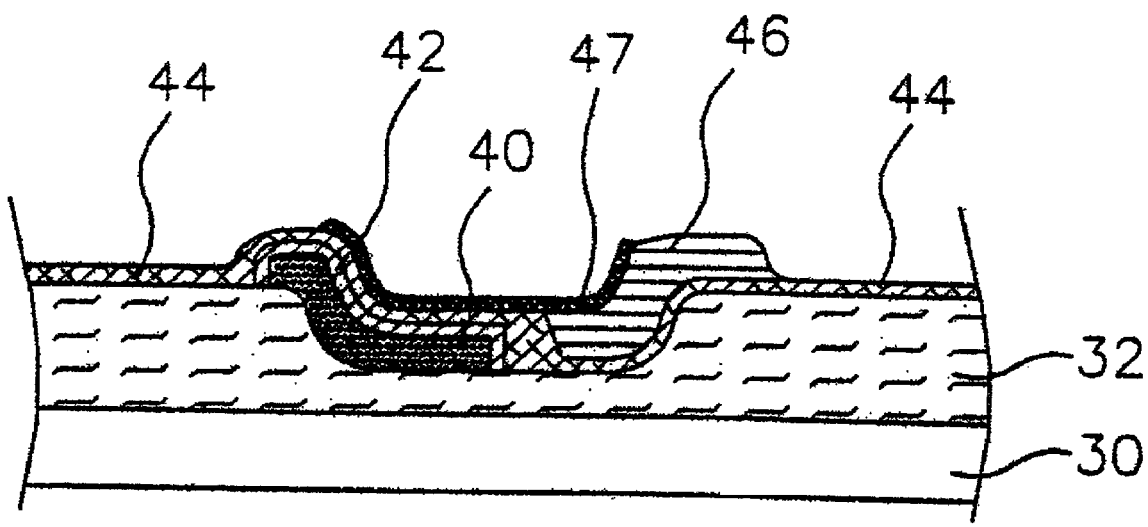
Figure 8B:
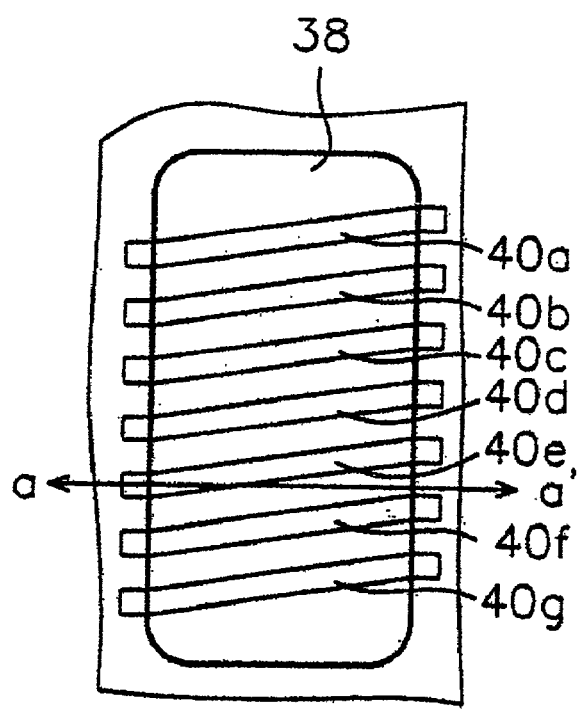

FIGS. 8A and 8B are views showing the semiconductor device after the lower conductive lines 40 and magnetic core are formed. The photosensitive film pattern 36 and a silicon nitride layer 34 are removed and a conductive material, for example, doped Poly-Si or Tungsten W is deposited on the entire surface of the substrate including the groove 38. The conductive material is patternized by a conventional method to form the lower conductive lines 40 across the groove 38. The lower conductive lines 40 are slanted longitudinally along the groove 38 with a predetermined distance therebetween. Then, an oxide film 42 is formed as a relief film on the lower conductive lines 40 to a thickness of 150 Å. At this time, the oxide film 42 is formed by either oxidizing the surfaces of the lower conductive lines 40a–40g or depositing or growing the oxide film 42 on the lower conductive lines 40a–40g. An oxidation prevention layer 44, e.g., a nitride, is deposited to a thickness of 500 Å over the entire surface of the substrate. Then, a buried layer 46 is formed in the gaps between the lower conductive lines 40 in the groove 38 using an etchback process to form a flux material such as spin-on glass SOG to a thickness of 2000 Å thereby burying the lower conductive lines 40a–40g in the groove 38 and then etching the flux material back until the oxdization prevention layer is exposed. Next, a core material, such as a magnetic or conductive material, is formed on the entire substrate to a thickness of 1000 Å and then limited to the groove 38 by wet or dry patterning, thereby forming a magnetic core 47.

Figure 9A:
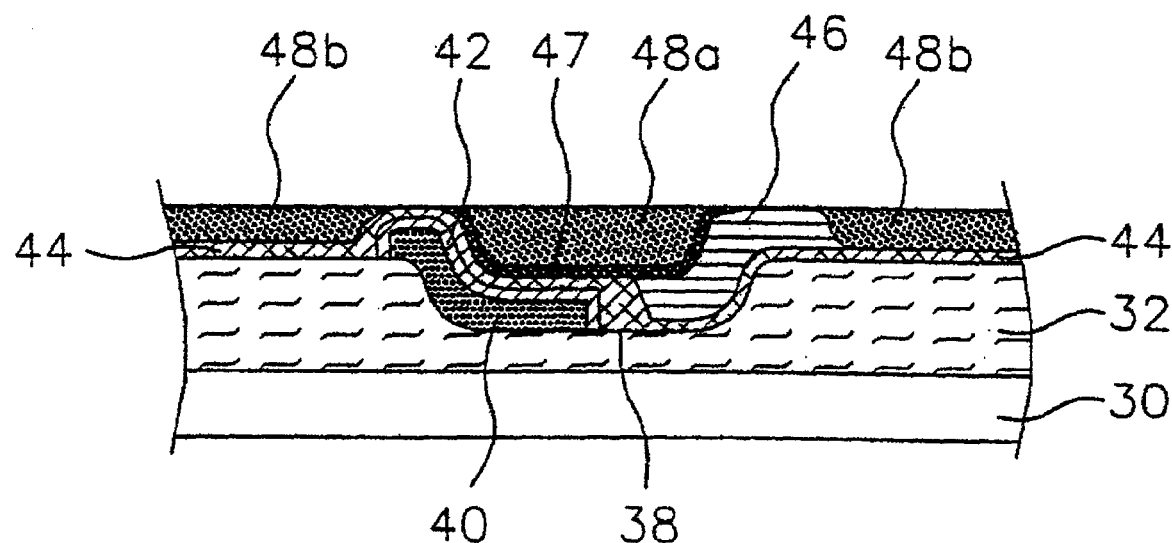
Figure 9B:
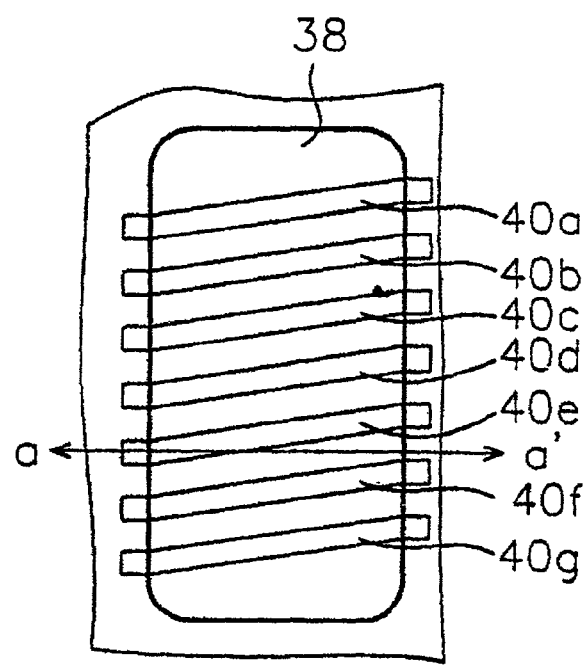

FIGS. 9A and 9B are views of the semiconductor device after an oxidizable material is formed on the device. The groove and surrounding substrate is covered with an oxidizable material 48, such as polysilicon or amorphous silicon to a thickness of 10,000 Å, and the oxidizable material is then flattened using a CMP or etchback process. At this time, the oxidizable material 48 is removed until the oxidization prevention layer 44 and the buried layer 46 are exposed. Therefore, the oxidizable material 48 is divided into two parts, a first relatively thicker portion 48a formed within, and filling, the concave portion of the groove 38, and a second relatively thinner portion 48b formed on the surrounding flat portion of the substrate.

Figure 10A:
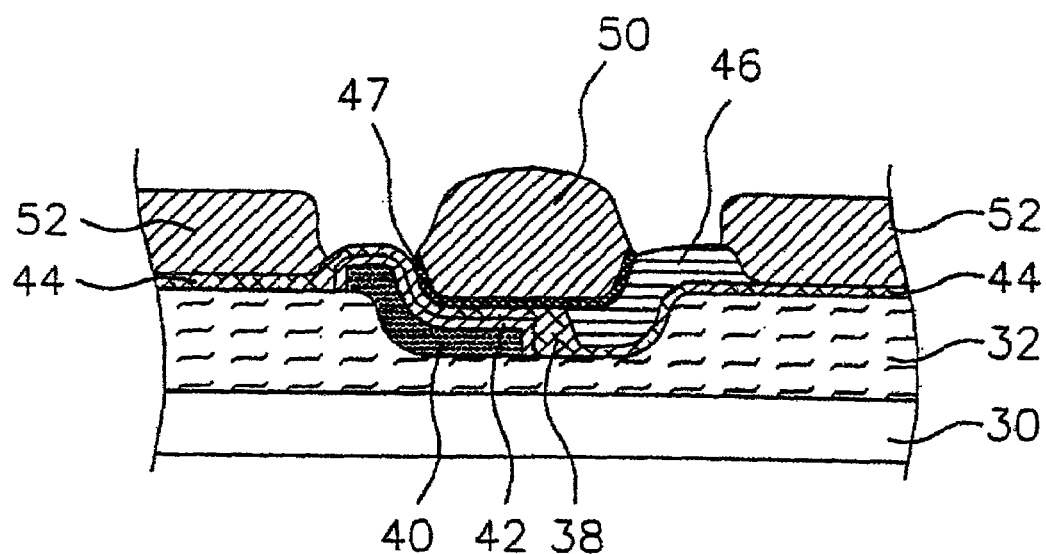
Figure 10B:
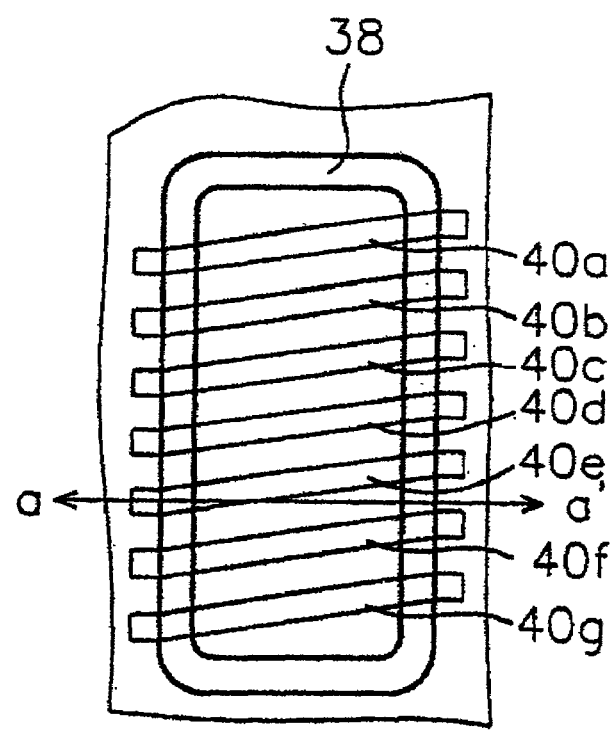

FIGS. 10A and 10B are views after insulators 50 and 52 are formed. An oxidization process, which expands the volume each of the oxidization portions, is performed on the oxidizable material 48a, 48b, thereby forming a thick oxide film 50.by oxidization of the silicon. Since the expanded volume depends on the initial thickness, the cylindrical insulator 50 is formed to a thickness that is greater than that of the peripheral insulators 52.

At this time, the oxide prevention layer 44 is maintained in an exposed state since it is not oxidized.

Figure 11A:
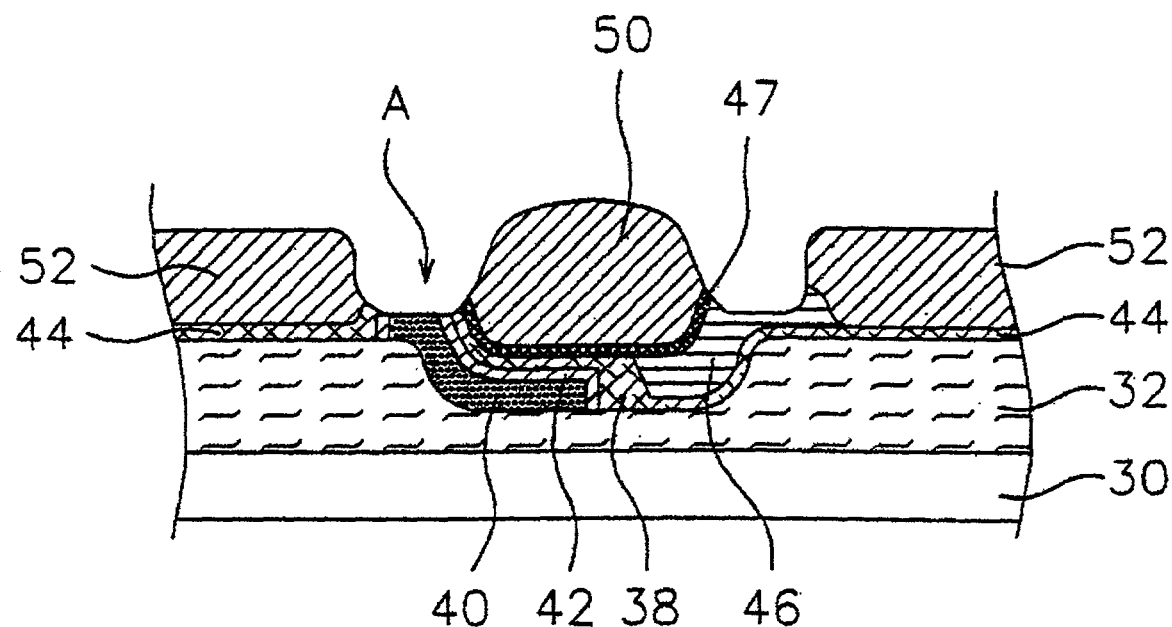
Figure 11B:
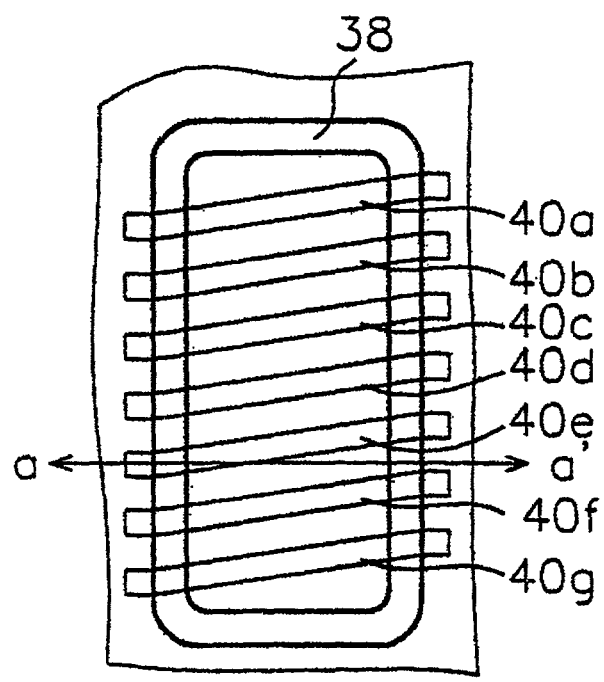

FIGS. 11A and 11B are views after contact regions A for connecting the upper conductive lines (not illustrated) and lower conductive lines 40 are formed. The contact region A is formed by lightly wet-etching the resulting surface of the substrate including the oxidization prevention layer 44 (and any oxide films which might have formed thereon), thereby exposing the lower conductive line 40.

Figure 12A:
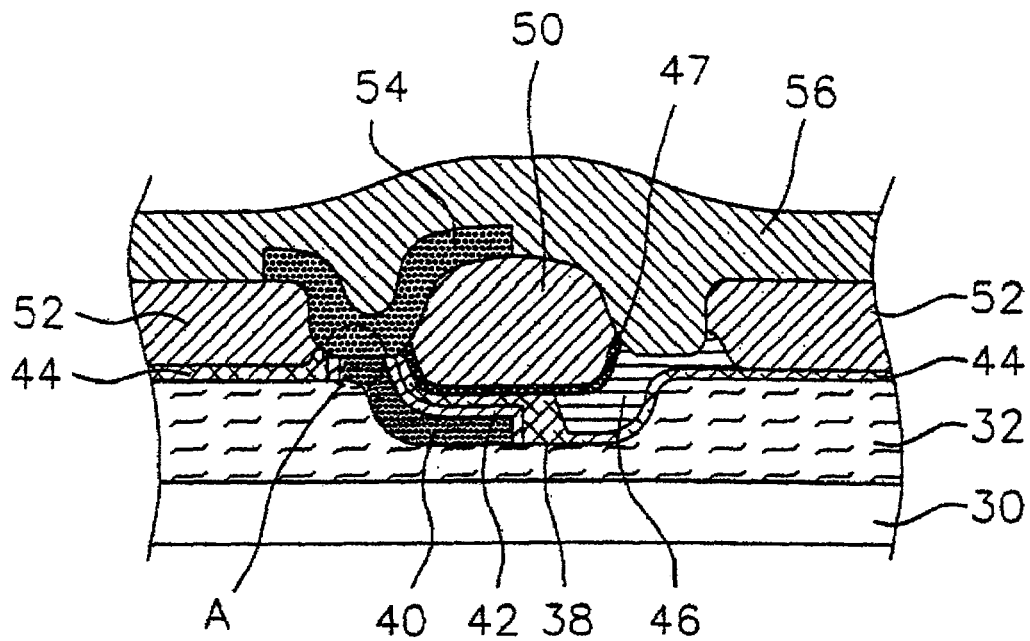
Figure 12B:
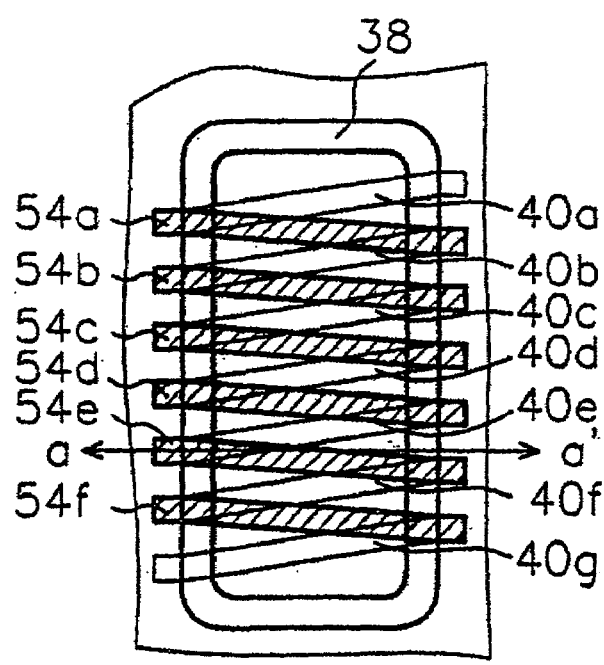

FIGS. 12A and 12B are views after the upper conductive lines 54 are formed. A conductive material such as doped Poly-Si or Tungsten is formed on the entire surface of the substrate, thereby contacting the lower conductive lines 40 through contact regions A. Next, the upper conductive lines 54 are formed across the cylindrical insulator 50 with a predetermined distance therebetween along the groove. The upper conductive lines 54 are formed by using a patternizing method and slanted longitudinally along the insulator in the opposite direction from the lower conductive lines 40a–40f. The upper conductive lines 54a–54f are formed such that both of their ends contact a neighboring lower conductive line through the contact regions A.

Next, an insulating material is formed over the entire semiconductor device on all surfaces of the substrate including the upper conductive lines 54, thereby forming an insulating layer 56 for protecting the cylindrical coil consisting of the lower and upper conductive lines. As shown in FIG. 12B, one end of the first lower conductive line 40a is connected to the one end of the upper conductive line 54a, and the other end of the upper conductive line 54a is connected to the other end of the lower conductive line 40b. The remaining conductive lines are connected in a similar manner. The insulator 50 assists the formation of a coil having a spiral shape.

Figure 13A:
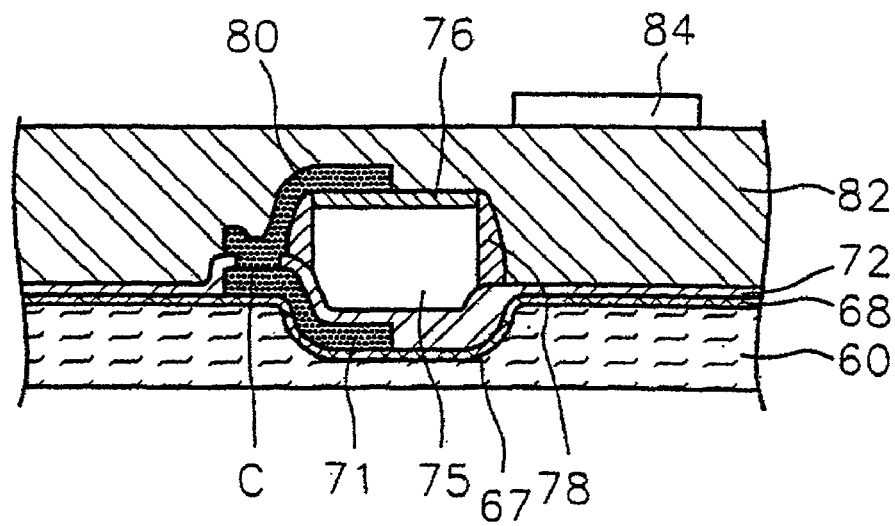
FIGS. 13A and 13B are a plan view and a sectional view of a second embodiment of a semiconductor device including inductors, which is manufactured in accordance with of the present invention.
Figure 13B:
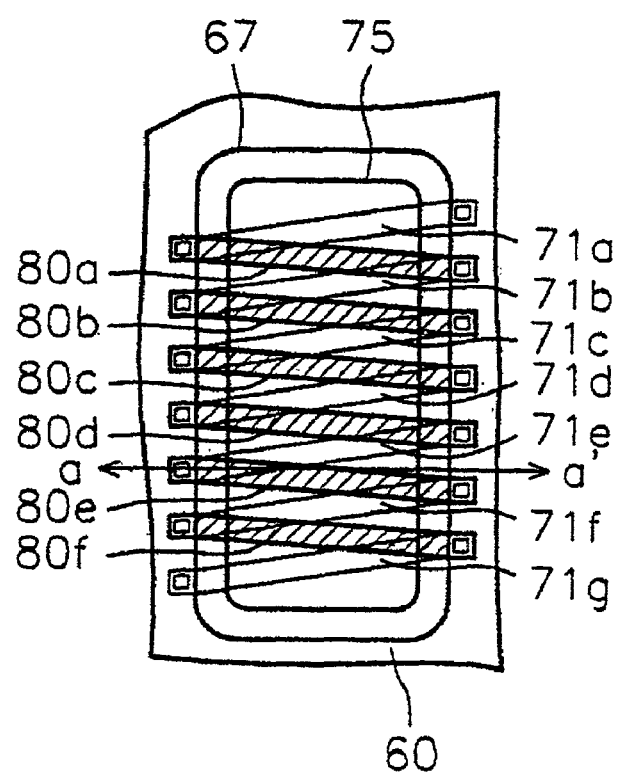

FIGS. 13A and 13B are a plan view and a sectional view of a second embodiment of a semiconductor device including inductors manufactured in accordance with the present invention.

As shown in FIG. 13A, a second embodiment of a semiconductor device including an inductor according to the present invention includes a groove having a semicircular cross-section 67 formed in an insulating layer 60 on a semiconductor substrate, an oxide film 68 formed on the entire surface of the substrate including the inner surface of the groove, lower conductive lines 71a–71g (collectively "71") formed across the groove 67 and slanted longitudinally along the groove with a predetermined distance therebetween, an oxide film 72 formed over the entire surface of the substrate including the lower conductive lines 71 to conform to the surface of the lower conductive lines, a magnetic core 75 formed over the oxide film 72 and aligned with the groove, a capping oxide layer 76 formed over the top of the core 75, oxide spacers 78 formed along the sides of the core 75, upper conductive lines 80a–80f (collectively "80") formed across the magnetic core 75 and slanted longitudinally along the core with a predetermined distance therebetween. The ends of upper conductive lines 80 contact the ends of corresponding lower conductive lines 71 through contact regions C. Therefore, the upper and lower conductive lines formed a coil having a cross-sectional shape that is more nearly circular than a conventional coil.

The semiconductor device of FIG. 14 further includes a protection layer 82 formed on the entire surface of the substrate including the magnetic core 75 and the upper conductive lines 80.

The lower and upper conductive lines 71 and 80 are formed from a conductive material such as doped-polysilicon Poly-Si or tungsten T, and substrate is made from a compound such as silicon or gallium arsenide (GaAs).

An inductor for a semiconductor device fabricated in accordance with the present invention as shown in FIG. 13 overcomes the problems associated with conventional inductors because the self-inductance does not depend the longitudinal length of the contact region for connecting the upper and lower conductive lines, but instead, depends on the thickness of the magnetic core 75. Furthermore, it is possible to form a circular coil since the upper and lower conductive lines are formed to enclose the core 75.

FIGS. 14 to 19 are views for illustrating the process flow of a second embodiment of a method of making a semiconductor device including inductors according to the present invention, wherein the "A" figures are sectional views and the "B" figures are plan views. FIGS. 14A and 15A are sectional views taken along with the lines a–a' in FIGS. 14B and 15B, respectively.

Figure 14A:
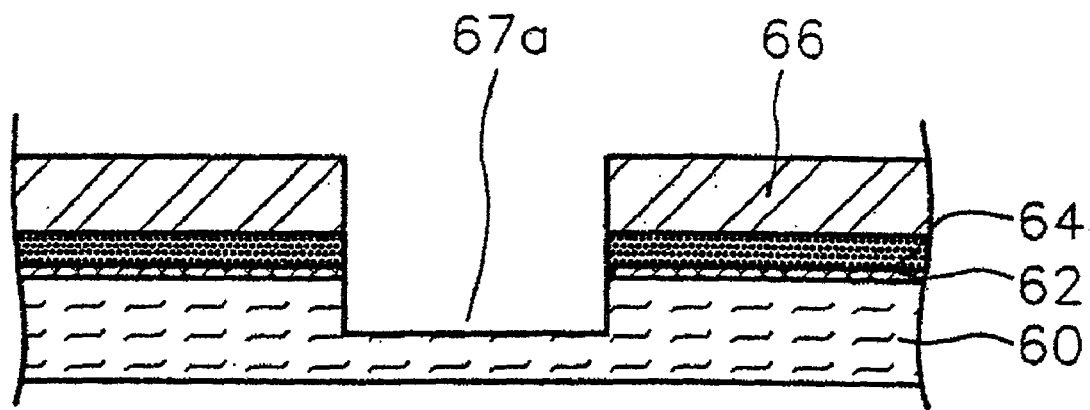
Figure 14B:
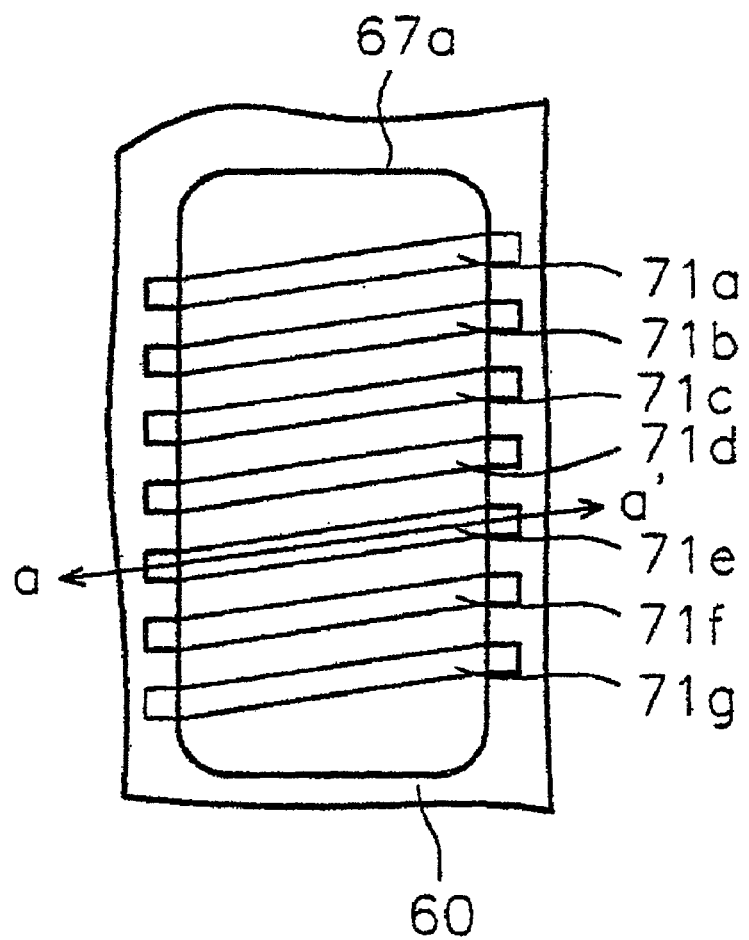

Referring to FIGS. 14A and 14B, an oxide film 62 for relief is grown on an insulating layer 60 to a thickness of 500 Å. A silicon nitride layer 64 and a high temperature oxide film 66 are then formed over the oxide film 62 to a thickness of 7000 Å. The high temperature oxide film 66, the silicon nitride layer 64 and the oxide film 62, are all etched along with the insulating layer 60 to a depth of 3 to 5 μm of thereby forming a trench 67a.

To form a groove having a semicircular cross-section, although it is not shown in the drawings, an oxide film is grown in the trench 67a to a thickness of 1 μm and thereafter removed by wet etching. Also, the high temperature oxide film 66, the silicon nitride layer 64, and the oxide film 62 for relief are removed to thereby form a groove 67 having a semicircular shape.

Figure 15A:
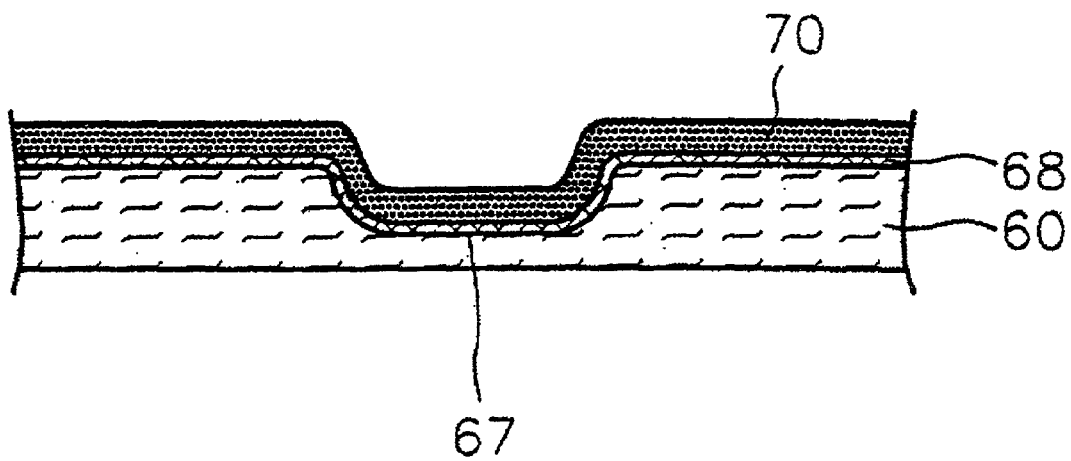
Figure 15B:
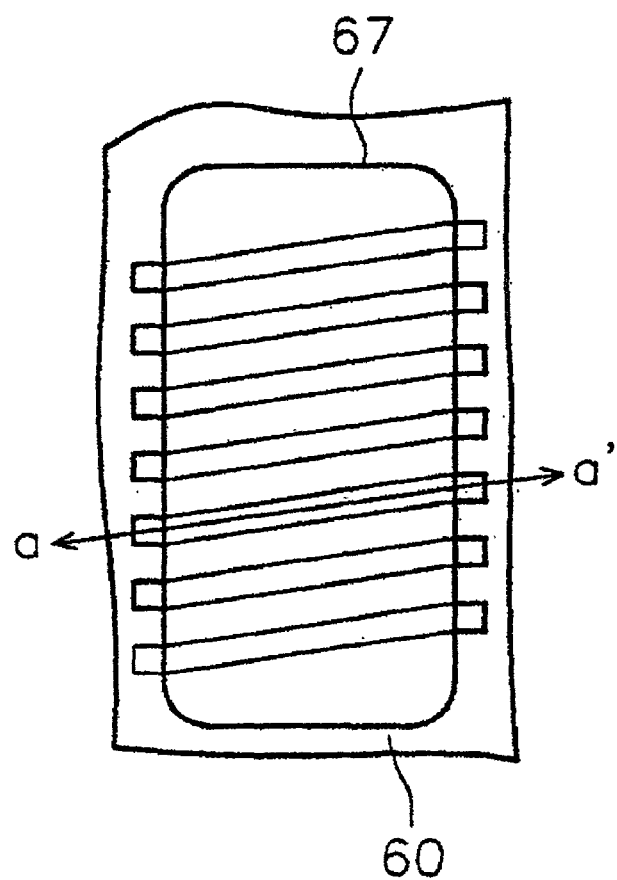

FIGS. 15A and 15B are sectional views after the lower conductive lines are formed. After the high temperature oxide film 66, the silicon nitride layer 64, and the oxide film 62 for relief are removed, an oxide film 68 is grown to a thickness of 2000 Å for insulating an inductor from the groove 67. Subsequently, a conductive material 70, such as doped Poly-Silicon, Aluminum or Copper is formed to a thickness of 2 μm.

Figure 16A:
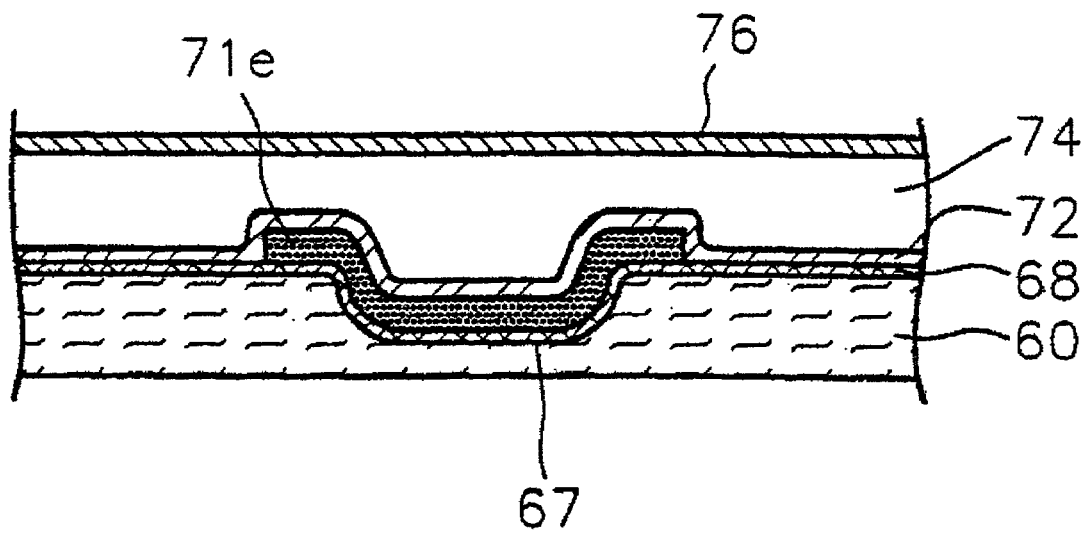
Figure 16B:
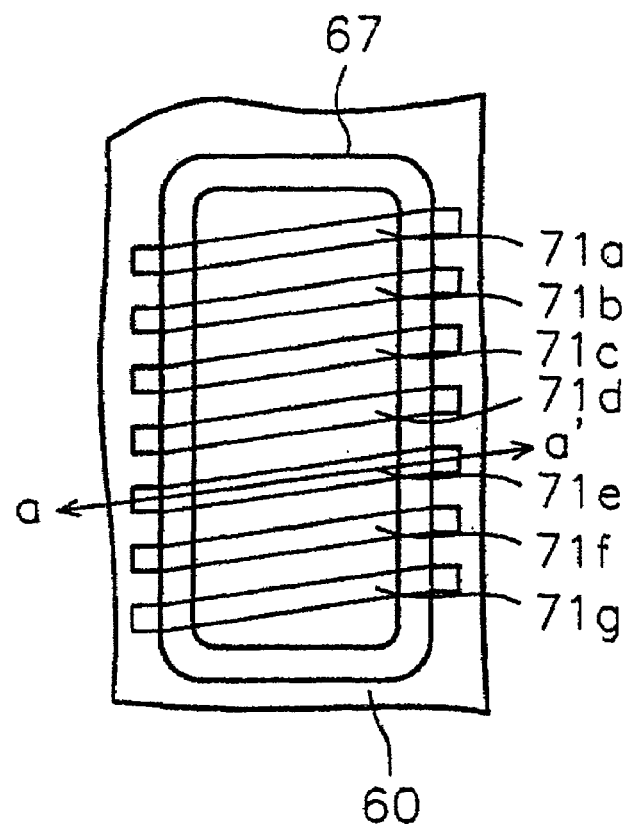

FIGS. 16A and 16B are sectional views after the lower conductive lines are formed. In FIGS. 16A and 16B, the conductive material 70 is patternized using a photosensitive film pattern (not shown) to form lower conductive lines 71(71a–71g) across the groove 67. At this time, the lower conductive lines 71 are slanted longitudinally along the groove with a predetermined distance therebetween.

An oxide layer 72 for insulating the interior of the inductor is formed to a thickness of 5000 Å. A core material 74, such as magnetic or conductive material, is then formed on the oxide film 72 and thereafter, a CMP process is performed so as to flatten the core material. A capping oxide layer 76 is then formed to a thickness of 5000 Å on the surface of the core material 74.

Figure 17A:
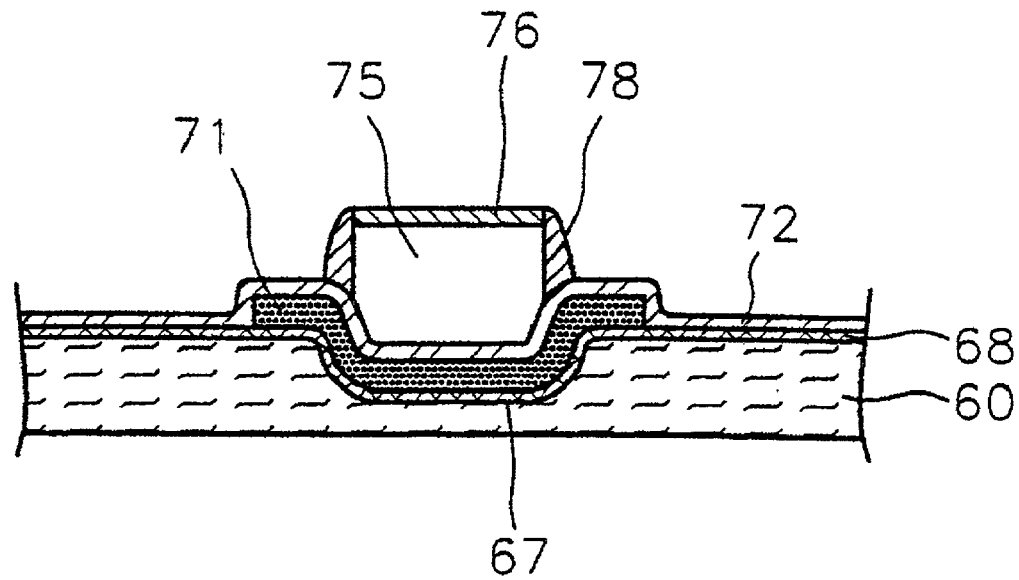
Figure 17B:
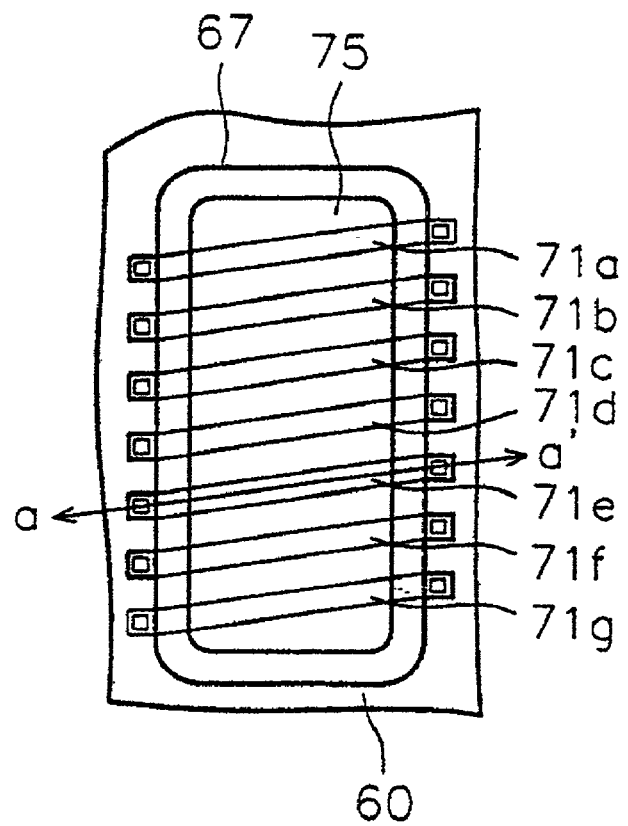

FIGS. 17A and 17B are sectional views after a magnetic core is formed.

The magnetic core 75 is formed by patternizing both the core material 74 and the capping oxide layer 76 using a photosensitive film pattern (not shown). An oxide layer is then formed to a thickness of 5000 Å and thereafter, anisotropicly-etched to formed a spacer 78. Therefore, the magnetic core 75 is isolated by the oxide films 72, 76 and 78.

Figure 18A:
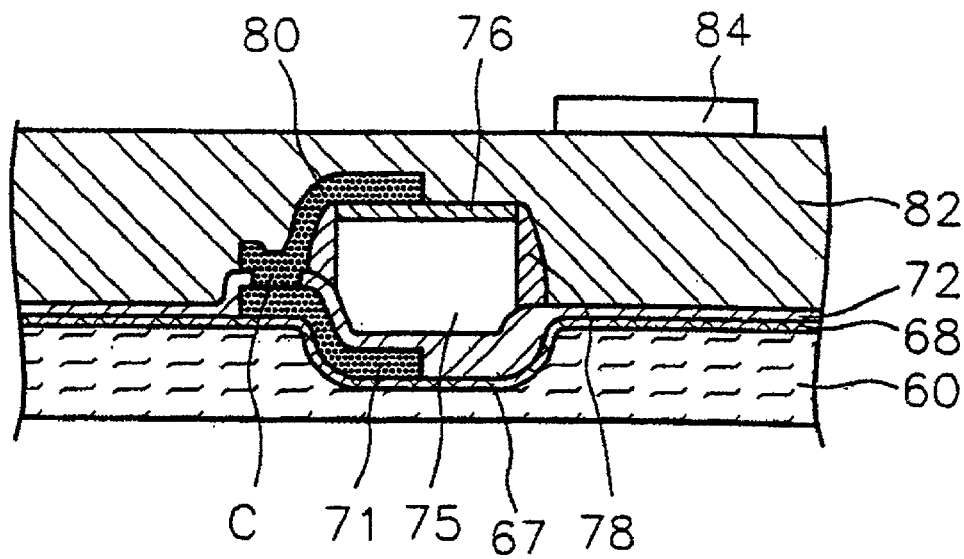
Figure 18B:
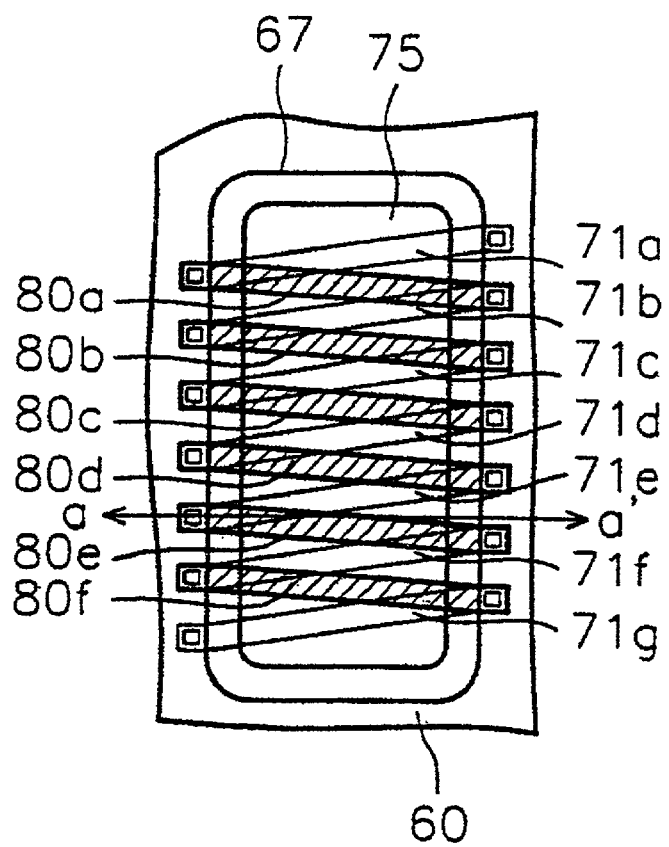

FIGS. 18A and 18B are sectional views after upper conductive lines are formed.

First, the oxide film 72 is etched to form contact holes C in order to expose both sides of each of the lower conductive lines 71. The upper conductive lines 80(80a–80f) are then formed with the same conductive material as the lower conductive lines. The upper conductive lines 80 are formed across the core 75 and slanted longitudinally along the core 75 in the opposite direction from the lower conductive lines so as to contact the ends of the corresponding lower conductive lines 71 through the contact holes C. An insulating material is then formed over the entire surface of the substrate including the upper conductive lines 80 to form an insulating layer 82.

At this time, one end of the lower conductive line 71a is connected to one end of the upper conductive line 80a. The other end of the upper conductive line 80a is connected to the other end of the lower conductive line 71b. The remaining conductive lines are connected in a similar manner.

Next, a metal wire 84 is formed at the lower conductive lines at both ends of the inductor to provide an electrical contact thereto. Wires can also be formed at other conductive wires to provide taps for obtaining different inductance values.

It can be seen that a coil formed from the upper and lower conductive lines 71, 80, which are connected through the contact holes C has a spiral shape.

Figure 19A:
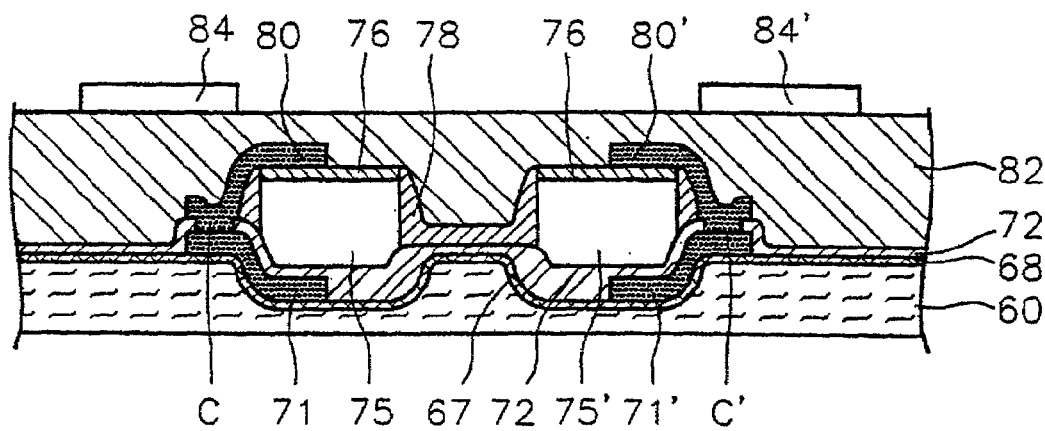
Figure 19B:
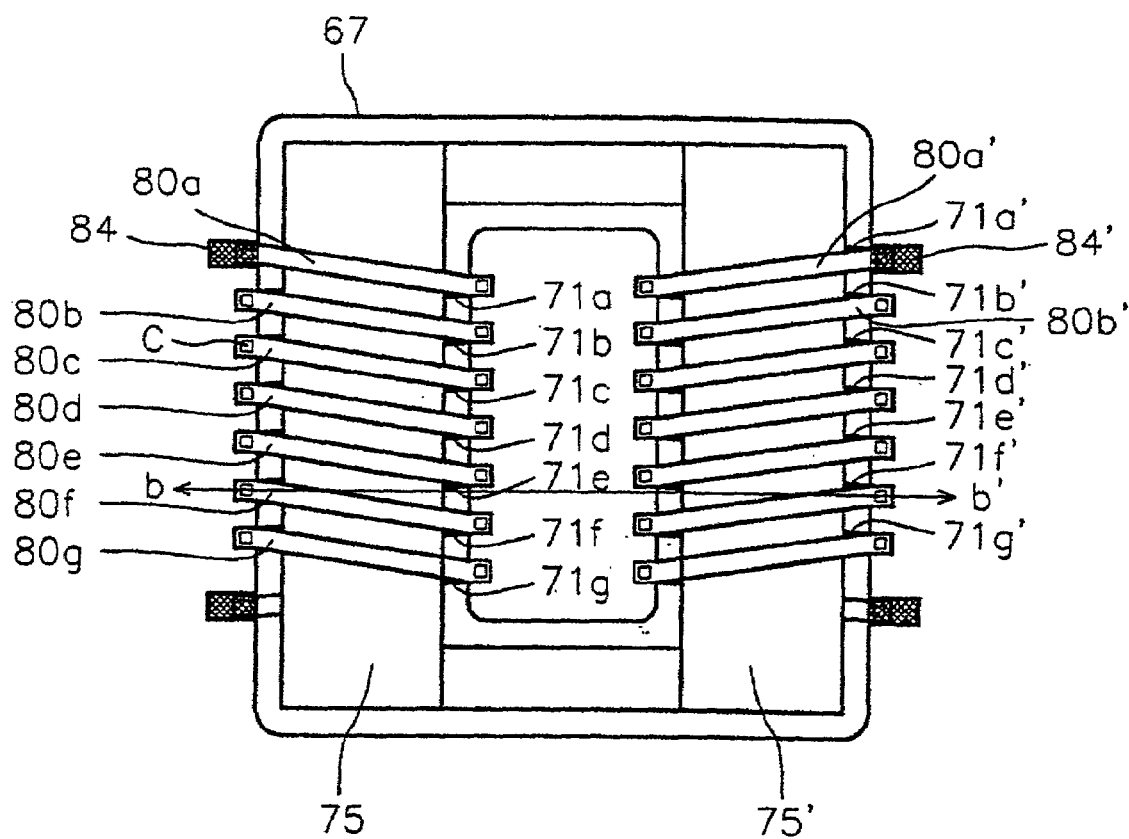

FIGS. 19A and 19B are a sectional view and plane view, respectively, of a third embodiment of the present invention. Two parallel grooves 67 are formed for an inductor which includes upper conductive lines 80(80a–80g), 80' (80a'–80g') and lower conductive lines 71(71a–71g), 71' (71a'–71g'). It can also be understood that the coil, which is formed from the upper and lower conductive lines has a spiral shape which does not have any angled portion caused by the insulator 50.

As described above, abrupt changes in the magnetic field of an inductor fabricated according to the present invention can be eliminated since the inductor has a spiral shape and the an increase in self-inductance can also be facilitated since the thickness of the insulator and the positional density of the conductive lines can be freely controlled.

While the present invention has been described and illustrated herein with reference to the preferred embodiment thereof, it will be understood by those skilled in the art that various changes in form and details may be made therein without departing from the spirit and scope of the invention.

What is claimed is:

1. A method of making a semiconductor device including inductors comprising;
    forming a semicircular columnar groove in an insulating layer on a semiconductor substrate;
    depositing a conductive material layer over the insulating layer having the groove;
    patterning the conductive material layer to form underlying conductive lines slantly longitudinally with a predetermined distance therebetween on said groove;
    forming a cylindrical insulating layer in said groove formed with said underlying conductive lines and on the surface of said substrate, wherein an upper portion of said cylindrical insulating layer protrudes from an upper surface of said groove; and
    forming upper conductive lines on said cylindrical insulating layer slantly longitudinally at an angle opposite the longitudinal slant of the underlying conductive lines with a predetermined distance between upper conductive lines to contact with said underlying conductive lines, wherein said upper conductive lines extend up and around said upper portion of said cylindrical insulating layer to form a rounded upper conductive line, the upper conductive lines having a substantially uniform thickness conformally formed on said insulator.

2. A method of malting a semiconductor device including inductors as claimed in claim 1, wherein said forming said groove further comprises:
    forming a nitride film on said insulating layer;
    forming a photosensitive film pattern for exposing said nitride film;
    etching said nitride film by using said photosensitive film pattern as a mask to be exposed said insulating layer; and
    etching said exposed insulating layer.

3. A method of making a semiconductor device including inductors as claimed in claim 2, wherein said etching is performed by any one of an isotropic etching method and a mixed method of anisotropic etching and isotropic etching.

4. A method of making a semiconductor device including inductors as claimed in claim 1, wherein said underlying conductive lines are slantly longitudinally formed along said groove to across.

5. A method of making a semiconductor device including inductors as claimed in claim 1, further comprising:
    forming an insulating layer on the surface of said underlying conductive lines;
    covering the surface of said substrate formed with said insulating layer with an oxidization prevention layer; and
    burying material between said upper conductive lines in said groove.

6. A method of making a semiconductor device including inductors as claimed in claim 5, wherein said buried material is a flux material, such as spin on glass.

7. A method of making a semiconductor device including inductors as claimed in claim 6, wherein said buried material is buried until said oxidization prevention layer is exposed when said flux material is etched back.

8. A method of malting a semiconductor device including inductors as claimed in claim 5, which further comprises forming a contact region by etching said insulating layer and said oxidization prevention layer for connecting said underlying and upper conductive lines after the burying.

9. A method of making a semiconductor device including inductors as claimed in claim 5, wherein said insulating layer is formed by oxidization of said underlying conductive lines.

10. A method of making a semiconductor device including inductors as claimed in claim 5, wherein an oxide film is formed on said underlying conductive lines.

11. A method of making a semiconductor device including inductors as claimed in claim 1, wherein said forming said insulating layer comprises;
    laminating an oxidizable material on the surface of said substrate to thereby be entirely buried said groove; and
    forming said insulating layer on the surface of said substrate and said groove by oxidization of said oxidizable material.

12. A method of making a semiconductor device including inductors as claimed 11, wherein said filling said groove with the oxidizable material further comprises:
    laminating oxidizable materials on the surface of said substrate to thereby bury said groove; and
    etching said oxidizable materials to fill only in said groove.

13. A method of making a semiconductor device including inductors as claimed 12, wherein said oxidizable materials is any one of polysilicon or amorphous silicon.

14. A method of making a semiconductor device including inductors as claimed in claim 11, wherein said oxidizable material is etched by CMP process.

15. A method of making a semiconductor device including inductors as claimed in claim 11, wherein said step of etching said oxidizable materials is performed by an etchback method.

16. A method of making a semiconductor device including an inductor comprising:
   forming a groove in an insulating layer on a semiconductor substrate;
   forming lower conductive lines across said groove;
   depositing a conductive material layer over the insulating layer having said groove;
   patterning the conductive material layer to form lower conductive lines slantly longitudinally across said groove;
   forming a cylindrical insulator above said lower conductive lines and aligned with the groove, wherein an upper portion of said cylindrical insulator protrudes from an upper surface of said groove;
   forming upper conductive lines over said insulator to form a rounded upper conductive line; and
   electrically coupling said upper conductive lines to said lower conductive lines.

17. A method of making a semiconductor device as claimed in claim 16, wherein said forming said groove further comprises:
   forming a nitride film on said insulating layer;
   forming a photosensitive film pattern on said nitride film;
   etching said nitride film by using said photosensitive film pattern as a mask to expose the insulating layer; and
   etching said exposed insulating layer.

18. A method of making a semiconductor device as claimed in claim 17, wherein said etching is performed by an isotropic etching method or a mixed method of anisotropic etching and isotropic etching.

19. A method of making a semiconductor device as claimed in claim 16, further comprising:
   forming a second insulating layer on the surface of said lower conductive lines;
   covering the surface of said substrate including said second insulating layer with an oxidization prevention layer; and
   burying a buried material between said upper conductive lines in said groove.

20. A method of making a semiconductor device as claimed in claim 19, wherein said buried material is a flux material such as spin on glass.

21. A method of making a semiconductor device as claimed in claim 20, wherein said buried material is buried until said oxidization prevention layer is exposed when said flux material is etched back.

22. A method of making a semiconductor device as claimed in claim 19, further comprising forming a contact region by etching said second insulating layer and said oxidization prevention layer for connecting said upper and lower conductive lines.

23. A method of making a semiconductor device as claimed in claim 19, wherein said second insulating layer is formed by oxidizing said lower conductive lines.

24. A method of making a semiconductor device as claimed in claim 19, wherein an oxide film is formed on said lower conductive lines.

25. A method of making a semiconductor device as claimed in claim 16, wherein said forming said cylindrical insulator comprises;
   filling said groove with an oxidizable material; and
   oxidizing said oxidizable material.

26. A method of making a semiconductor device as claimed in claim 25, wherein said filling said groove with an oxidizable material comprises:
   laminating an oxidizable material on the entire surface of said substrate; and
   etching said oxidizable material.

27. A method of making a semiconductor device as claimed in claim 26, wherein said oxidizable material is polysilicon or amorphous silicon.

28. A method of making a semiconductor device as claimed in claim 26, wherein said oxidizable material is etched by a CMP process.

29. A method of making a semiconductor device as claimed in claim 26, wherein said etching of said oxidizable material is performed by an etch-back method.

30. A method of making a semiconductor device as claimed in claim 16, wherein said upper and lower conductive lines are slanted longitudinally along the grove in opposite directions.

31. A method of making a semiconductor device comprising:
   forming an insulating layer on a semiconductor substrate;
   forming a groove in the insulating layer;
   forming lower conductive lines slantly longitudinally on the groove, the lower conductive lines spaced apart from each other;
   filling the groove with an oxidizable material layer overlying the lower conductive lines,
   growing the oxidizable material layer by oxidation to form a cylindrical insulating layer in the groove such that an upper portion of the cylindrical insulator protrudes from an upper surface of the groove; and
   forming upper conductive lines on the insulator to be in contact with the underlying lower conductive lines.

32. The method of claim 31, wherein the upper conductive lines extend up and around said upper portion of said cylindrical insulator to form a rounded upper conductive line.

* * * * *

UNITED STATES PATENT AND TRADEMARK OFFICE
CERTIFICATE OF CORRECTION

| | |
|---|---|
| PATENT NO. | : 7,033,880 B2 |
| APPLICATION NO. | : 09/935002 |
| DATED | : April 25, 2006 |
| INVENTOR(S) | : Rhee |

It is certified that error appears in the above-identified patent and that said Letters Patent is hereby corrected as shown below:

At column 9, line 62, please replace "malting" with --making--.

Signed and Sealed this

Tenth Day of July, 2007

JON W. DUDAS
*Director of the United States Patent and Trademark Office*